(12) United States Patent
Lee et al.

(10) Patent No.: US 8,633,484 B2
(45) Date of Patent: Jan. 21, 2014

(54) ORGANIC LIGHT EMITTING DISPLAY AND METHOD OF FABRICATING THE SAME

(75) Inventors: Won-Kyu Lee, Yongin (KR); Tae-Hoon Yang, Yongin (KR); Bo-Kyung Choi, Yongin (KR); Byoung-Kwon Choo, Yongin (KR); Kyu-Sik Cho, Yongin (KR); Yong-Hwan Park, Yongin (KR); Sang-Ho Moon, Yongin (KR); Min-Chul Shin, Yongin (KR); Yun-Gyu Lee, Yongin (KR); Joon-Hoo Choi, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 205 days.

(21) Appl. No.: 13/064,379

(22) Filed: Mar. 22, 2011

(65) Prior Publication Data
US 2011/0297949 A1    Dec. 8, 2011

(30) Foreign Application Priority Data
Jun. 3, 2010    (KR) .................. 10-2010-0052428

(51) Int. Cl.
*H01L 31/00*     (2006.01)
(52) U.S. Cl.
USPC .............. 257/59; 257/49; 257/57; 257/66; 257/72; 257/E51.005; 257/E51.006; 438/142; 438/149; 438/151; 438/166
(58) Field of Classification Search
USPC ............... 257/59, 72, E51.005, 49, 57, 66, 257/E51.006; 438/149, 142, 151, 166
See application file for complete search history.

(56) References Cited

U.S. PATENT DOCUMENTS

| 5,275,851 A * | 1/1994 | Fonash et al. ............ 438/479 |
| 2005/0116292 A1* | 6/2005 | Koo et al. ............... 257/347 |
| 2005/0275019 A1* | 12/2005 | Seo et al. ............... 257/347 |
| 2008/0296565 A1* | 12/2008 | Park et al. ............... 257/40 |

FOREIGN PATENT DOCUMENTS

| KR | 10 2003-0057150 A | 7/2003 |
| KR | 10 2005-0117133 A | 12/2005 |
| KR | 10 2006-0003706 A | 1/2006 |
| KR | 10 2007-0024017 A | 3/2007 |
| KR | 10 2008-0025830 A | 3/2008 |
| KR | 10 2011-0056084 A | 5/2011 |

* cited by examiner

*Primary Examiner* — Kenneth Parker
*Assistant Examiner* — John Lin
(74) *Attorney, Agent, or Firm* — Lee & Morse, P.C.

(57) ABSTRACT

An organic light emitting display and method of fabricating thereof, the display including a substrate including a first thin film transistor region and a second thin film transistor region; a buffer layer on the substrate; a first and a second semiconductor layer on the buffer layer; a gate insulating layer on the substrate; gate electrodes on the gate insulating layer and corresponding to the first semiconductor layer and the second semiconductor layer, respectively; source/drain electrodes insulated from the gate electrode and being connected to the first semiconductor layer and the second semiconductor layer, respectively; an insulating layer on the substrate; a first electrode connected to the source/drain electrode electrically connected to the first semiconductor layer; an organic layer on the first electrode; and a second electrode on the organic layer, wherein portions of the buffer layer corresponding to a source/drain region of the first semiconductor layer include a metal catalyst.

34 Claims, 20 Drawing Sheets

ORGANIC LIGHT EMITTING DISPLAY AND METHOD OF FABRICATING THE SAME

BACKGROUND

1. Field

Embodiments relate to an organic light emitting display and a method of fabricating the same.

2. Description of the Related Art

A polycrystalline silicon layer may be applied to a high electric field mobility and high-speed operation circuit and may be configured of a CMOS circuit, such that it has been mainly used as a semiconductor layer for a thin film transistor. The thin film transistor using the polycrystalline silicon layer may be used for an active device for an active matrix liquid crystal display (AMLCD) and a switching device and a driving device of an organic light emitting diode (OLED).

Methods of crystallizing amorphous silicon into polycrystalline silicon may include, e.g., a solid phase crystallization method, an excimer laser crystallization method, a metal induced crystallization method, and a metal induced lateral crystallization method, or the like.

The polycrystalline silicon layer formed by the solid phase crystallization may form a silicon layer having a uniform crystal size, but may have a small crystal size.

The metal induced crystallization (MIC) method, the metal induced lateral crystallization (MILC) method, a super grain silicon crystallization (SGS) method, etc., using a metal catalyst, may form a polycrystalline silicon layer having a large crystal size.

The above information disclosed in this Background section is only for enhancement of understanding of the background of the described technology and therefore it may contain information that does not form the prior art that is already known in this country to a person of ordinary skill in the art.

SUMMARY

Embodiments are directed to an organic light emitting display and a method of fabricating the same.

At least one of the above and other features and advantages may be realized by providing an organic light emitting display including a substrate, the substrate including a first thin film transistor region and a second thin film transistor region; a buffer layer on the substrate; a first semiconductor layer and a second semiconductor layer on the buffer layer; a gate insulating layer on the substrate; gate electrodes on the gate insulating layer, the gate electrodes corresponding to the first semiconductor layer and the second semiconductor layer, respectively; source/drain electrodes insulated from the gate electrode, one of the source/drain electrodes being electrically connected to the first semiconductor layer and another of the source drain electrodes being electrically connected to the second semiconductor layer, respectively; an insulating layer on the substrate; a first electrode connected to the one source/drain electrode electrically connected to the first semiconductor layer; an organic layer on the first electrode; and a second electrode on the organic layer, wherein portions of the buffer layer corresponding to a source/drain region of the first semiconductor layer include a metal catalyst.

The first semiconductor layer may be a driving semiconductor layer.

The first semiconductor layer may include a polycrystalline silicon layer crystallized by a metal catalyst.

The second semiconductor layer may include a polycrystalline silicon layer crystallized by a solid phase crystallization method.

The metal catalyst may include at least one of Ni, Pd, Ag, Au, Al, Sn, Sb, Cu, Tr, and Cd.

The organic light emitting display may further include any one of a silicon oxide layer, a silicon nitride layer, or a double layer thereof between the buffer layer and first semiconductor layer and between the buffer layer and the second semiconductor layer.

The buffer layer may have a thickness of about 400 Å to about 9,900 Å.

At least one of the above and other features and advantages may also be realized by providing a method for fabricating an organic light emitting display, the method including providing a substrate including a first thin film transistor region and a second thin film transistor region; forming a buffer layer on the substrate; forming a first semiconductor layer and a second semiconductor layer on the buffer layer; forming an etch stop layer on the first semiconductor layer and the second semiconductor layer; forming source/drain electrodes such that the source/drain electrodes are electrically connected to the first semiconductor layer and the second semiconductor layer, respectively; forming a gate insulating layer on the substrate; forming gate electrodes on the gate insulating layer such that one gate electrode corresponds to the first semiconductor layer and another gate electrode corresponds to the second semiconductor layer; forming an insulating layer on the substrate; forming a first electrode such that the first electrode is connected to the one source/drain electrode corresponding to the first semiconductor layer; forming an organic layer on the first electrode such that the organic layer includes an organic light emitting layer; and forming a second electrode on the organic layer, wherein portions of the buffer layer on a lower portion of the first semiconductor layer include a metal catalyst.

The method may further include forming a metal catalytic layer on the buffer layer, diffusing the metal catalyst of the metal catalytic layer to the buffer layer by heat treating the substrate, and removing the metal catalytic layer.

The portions of the buffer layer including the metal catalyst may be a metal catalytic region and may correspond to the first semiconductor layer.

The method may further include etching a surface of the buffer layer except for the metal catalytic region after diffusing the metal catalyst to the buffer layer.

About 100 Å to about 2,000 Å of the buffer layer may be etched.

Forming the first semiconductor layer may include crystallizing a polycrystalline silicon layer with the metal catalyst, and patterning the crystallized polycrystalline silicon layer.

Forming the second semiconductor layer may include crystallizing a polycrystalline silicon layer by a solid phase crystallization method, and patterning the crystallized polycrystalline silicon layer.

At least one of the above and other features and advantages may also be realized by providing an organic light emitting display including a substrate, the substrate including a first thin film transistor region and a second thin film transistor; a buffer layer on the substrate; a first semiconductor layer and a second semiconductor layer on the buffer layer; an etch stop layer on the first semiconductor layer and the second semiconductor layer; source/drain electrodes, one of the source/drain electrodes being electrically connected to the first semiconductor layer and another of the source/drain electrodes being electrically connected to the second semiconductor layer; a gate insulating layer on the substrate; gate electrodes on the gate insulating layer, the gate electrodes corresponding to the first semiconductor layer and the second semiconductor layer, respectively; an insulating layer on the substrate; a first electrode connected to the one source/drain electrode electrically connected to the first semiconductor layer; an organic layer on the first electrode; and a second electrode on the organic layer, wherein portions of the buffer layer corresponding to a source/drain region of the first semiconductor layer include a metal catalyst.

The first semiconductor layer may be a driving semiconductor layer.

The first semiconductor layer may include a polycrystalline silicon layer crystallized by a metal catalyst.

The second semiconductor layer may include a polycrystalline silicon layer crystallized by a solid phase crystallization method.

The metal catalyst may include at least one of Ni, Pd, Ag, Au, Al, Sn, Sb, Cu, Tr, and Cd.

The organic light emitting display may further any one of a silicon oxide layer, a silicon nitride layer, or a double layer thereof between the first semiconductor layer and the buffer layer and between the second semiconductor layer and the buffer layer.

The buffer layer may have a thickness of about 400 Å to about 9,900 Å.

At least one of the above and other features and advantages may also be realized by providing an organic light emitting display including a substrate, the substrate including a first thin film transistor region and a second thin film transistor region; gate electrodes on the first thin film transistor region and the second thin film transistor region of the substrate, respectively; a gate insulating layer on the substrate; a first semiconductor layer and a second semiconductor layer on the gate insulating layer; an etch stop layer on the first semiconductor layer and the second semiconductor layer; source/drain electrodes, one of the source/drain electrodes being electrically connected to the first semiconductor layer and another of the source drain electrodes being electrically connected to the second semiconductor layer; an insulating layer on the substrate; a first electrode connected to the one source/drain electrode electrically connected to the first semiconductor layer; an organic layer on the first electrode; and a second electrode on the organic layer, wherein portions of the gate insulating layer corresponding to a source/drain region of the first semiconductor layer include a metal catalyst.

The first semiconductor layer may be a driving semiconductor layer.

The first semiconductor layer may include a polycrystalline silicon layer crystallized by a metal catalyst.

The second semiconductor layer may include a polycrystalline silicon layer crystallized by a solid phase crystallization method.

The metal catalyst may include at least one of Ni, Pd, Ag, Au, Al, Sn, Sb, Cu, Tr, and Cd.

The first semiconductor layer may include a metal catalyst.

The organic light emitting display may further include any one of a silicon oxide layer, a silicon nitride layer, or a double layer thereof between the first semiconductor layer and the buffer layer and between the second semiconductor layer and the buffer layer.

The buffer layer may have a thickness of about 400 Å to about 9,900 Å.

At least one of the above and other features and advantages may also be realized by providing a method for fabricating an organic light emitting display, the method including providing a substrate that includes a first thin film transistor region and a second thin film transistor region; forming gate electrodes on the first thin film transistor region and the second thin film transistor region of the substrate, respectively; forming a gate insulating layer on the substrate; forming a first semiconductor layer and a second semiconductor layer on the gate insulating layer; forming an etch stop layer on the first semiconductor layer and the second semiconductor layer; forming source/drain electrodes such that one of the source/drain electrodes is electrically connected to the first semiconductor layer and another of the source/drain electrodes is electrically connected to the second semiconductor layer; forming an insulating layer on the substrate; forming a first electrode connected to the one source/drain electrode electrically connected to the first semiconductor layer; forming an organic layer on the first electrode such that the organic layer includes an organic light emitting layer; and forming a second electrode on the organic layer, wherein at least a portion of the gate insulating layer on a lower region of the first semiconductor layer is a metal catalytic region and includes a metal catalyst.

The method may further include forming a metal catalytic layer on the gate insulating layer, diffusing a metal catalyst of the metal catalytic layer to the gate insulating layer by heat treating the substrate, and removing the metal catalytic layer.

The metal catalytic region may include the metal catalyst of the gate insulating layer, the metal catalytic region corresponding to the first semiconductor layer.

The method may further include etching a surface of the gate insulating layer except for the metal catalytic region after diffusing the metal catalyst to the gate insulating layer.

Forming the first semiconductor layer may include crystallizing a polycrystalline silicon layer with the metal catalyst, and patterning the crystallized polycrystalline silicon layer.

Forming the second semiconductor layer may include crystallizing a polycrystalline silicon layer by a solid phase crystallization method, and patterning the crystallized polycrystalline silicon layer.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1A:
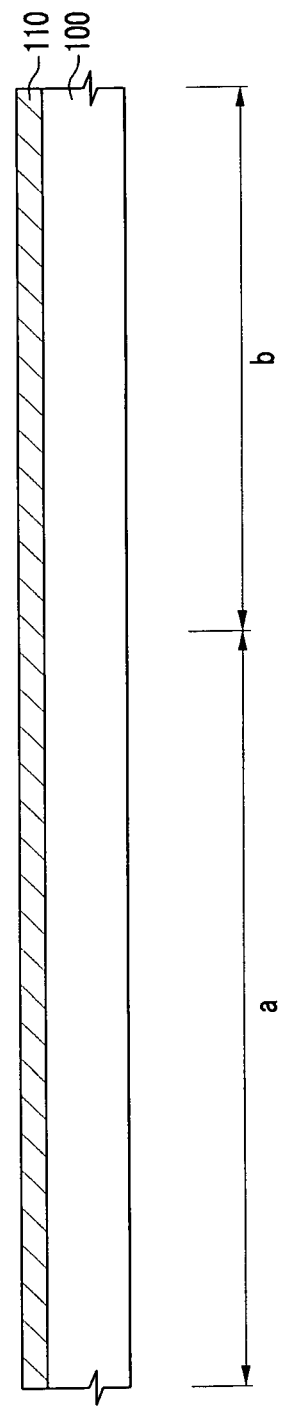
FIGS. 1A to 1H illustrate diagrams showing an organic light emitting display and stages in a method of fabricating the same, according to an embodiment.

Korean Patent Application No. 10-2010-0052428, filed on Jun. 3, 2010, in the Korean Intellectual Property Office, and entitled: "Organic Light Emitting Display and the Fabricating Method of the Same," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

FIGS. 1A to 1H illustrate diagrams showing an organic light emitting display and stages in a method of fabricating the same, according to an embodiment.

Referring first to FIG. 1A, a substrate 100 including a first thin film transistor region "a" and a second thin film transistor region "b" may be provided. The substrate 100 may be made of a suitable substrate material including, e.g., glass, plastic, or the like. Then, a buffer layer 110 may be formed on the substrate 100. The buffer layer 110 may be formed as a single layer of an insulating material, e.g., a silicon oxide layer, a silicon nitride layer, etc., or a multi-layer thereof by using, e.g., a chemical vapor deposition method or a physical vapor deposition method. The buffer layer 110 may have a thickness of about 500 Å to about 10,000 ÅA. Preferably, the buffer layer 100 has a thickness of about 1,000 Å to about 5,000 Å. Such thicknesses may be suitable for performing the functions of a buffer layer in consideration of subsequent etching of the buffer layer.

Figure 1B:
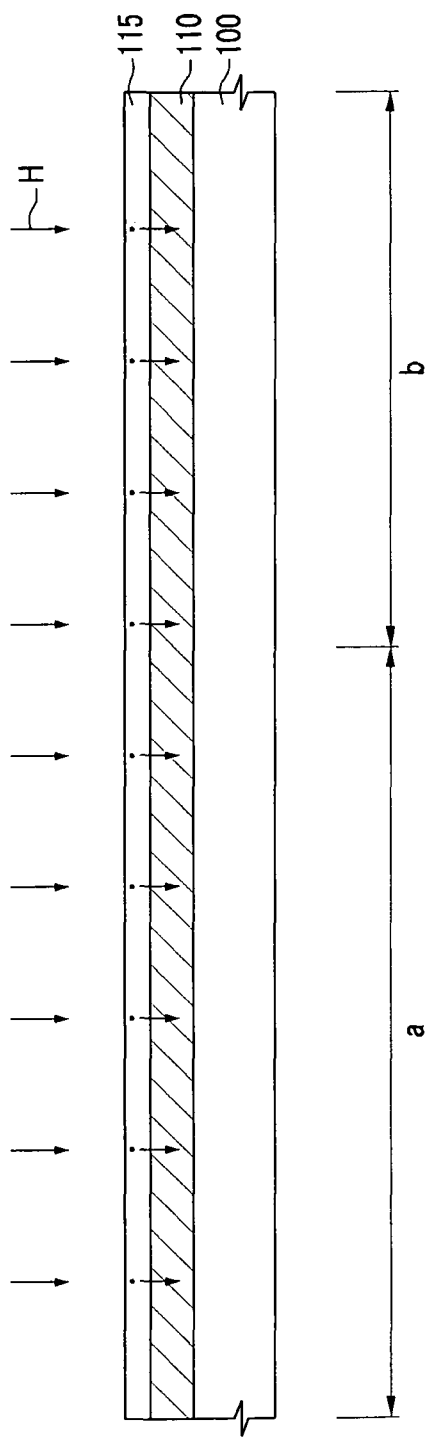

Next, referring to FIG. 1B, a metal catalyst may be deposited on the buffer layer 110 to form a metal catalytic layer 115.

The metal catalyst may include, e.g., Ni, Pd, Ag, Au, Al, Sn, Sb, Cu, Tr, and/or Cd. Preferably, the metal catalyst includes nickel (Ni).

The metal catalytic layer 115 may be formed on the buffer layer 110 at a surface density of about 1011 to about 1015 atoms/cm$^2$. Maintaining the surface density of the metal catalyst at about 1011 atoms/cm$^2$ or greater may help ensure that crystallization nucleation, e.g., an amount of seed, is not reduced, thereby ensuring ease of crystallizing the amorphous silicon layer by the SGS method. Maintaining the surface density of the metal catalyst at about 1015 atoms/cm$^2$ or less may help ensure that an amount of metal catalyst diffused into the amorphous silicon layer is not increased and a remaining amount of metal catalyst is not increased, such that characteristics of the semiconductor layer formed by patterning the polycrystalline silicon layer are not degraded.

Then, the substrate 100 may be subjected to the heat treatment (H) to diffuse the metal catalyst of the metal catalytic layer 115 to the buffer layer 110. Then, the metal catalytic layer 115 may be removed.

The heat treatment (H) process may be performed for several seconds to several hours at about 200 to about 900° C. to diffuse the metal catalyst. When the heat treatment (H) process is performed at the above-described temperatures and times, deformation of the substrate due to the excessive heat treatment process may be prevented, manufacturing cost may be lowered, and yield may be improved.

The heat treatment (H) process may include any one of, e.g., a furnace process, a rapid thermal annealing (RTA) process, a UV process, and a laser process.

Figure 1C:
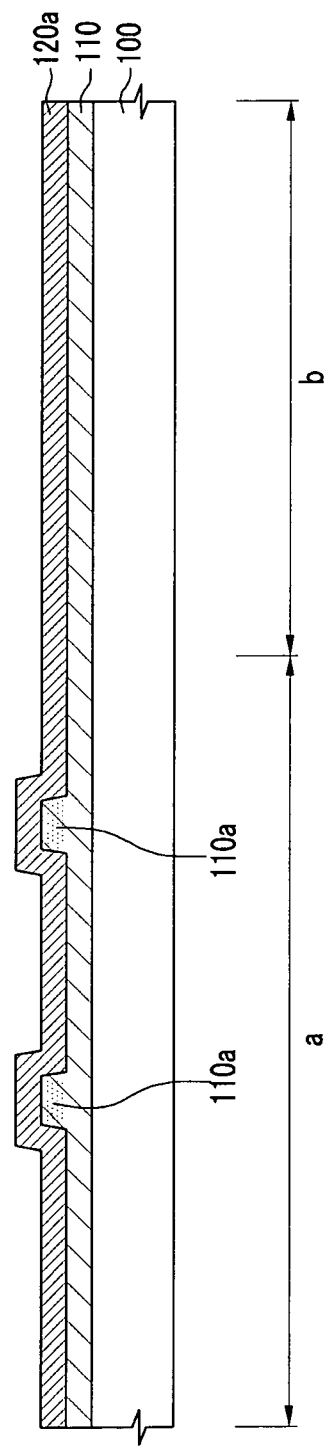

Then, referring to FIG. 1C, portions of the buffer layer 110 in the first thin film transistor region "a" may not be etched while remaining surfaces of the buffer layer 110 may be etched.

The buffer layer 110 may be etched by about 100 Å to about 2,000 Å. In other words, about 100 Å to about 2,000 Å of the buffer layer 110 may be removed. Preferably, the buffer layer 110 is etched by about 100 Å to about 1,000 Å. An upper portion of the buffer layer 110, e.g., where the metal catalyst diffused to the buffer layer 100 has concentrated, may be etched or removed; and a portion, i.e., a metal catalytic region 110a of the buffer layer 110 where the metal catalyst is diffused may remain in a portion of the first thin film transistor region "a."

A thickness of the buffer layer 110 remaining after etching may be about 400 Å to about 9,900 Å, except for the metal catalytic region 110a where the metal catalyst is diffused, i.e., the non-etched portion. Such a thickness may be suitable for performing functions of a buffer layer.

Then, an amorphous silicon layer 120a may be formed on the substrate 100. For example, the amorphous silicon layer 120a may be formed on the substrate 100 having the buffer layer 110 thereon.

Then, a heat treatment may be performed on the substrate 100 including the amorphous silicon layer 120a thereon to crystallize the amorphous silicon layer into a polycrystalline silicon layer.

The heat treatment may include a heat treatment method used in a solid phase crystallization method, e.g., a field enhanced rapid thermal annealing (FERTA) method, etc.

The amorphous silicon layer 120a on the metal catalytic region 110a of the buffer layer in the first thin film transistor region "a" may be crystallized by the metal catalyst of the metal catalytic region 110a. For example, the metal catalyst may form a seed at a contact interface between the amorphous silicon layer and the buffer layer and may be crystallized by the heat treatment.

Remaining portions of the amorphous silicon layer 120a, e.g., in the second thin film resistor region "b," may be crystallized by the solid phase crystallization method.

Figure 1D:
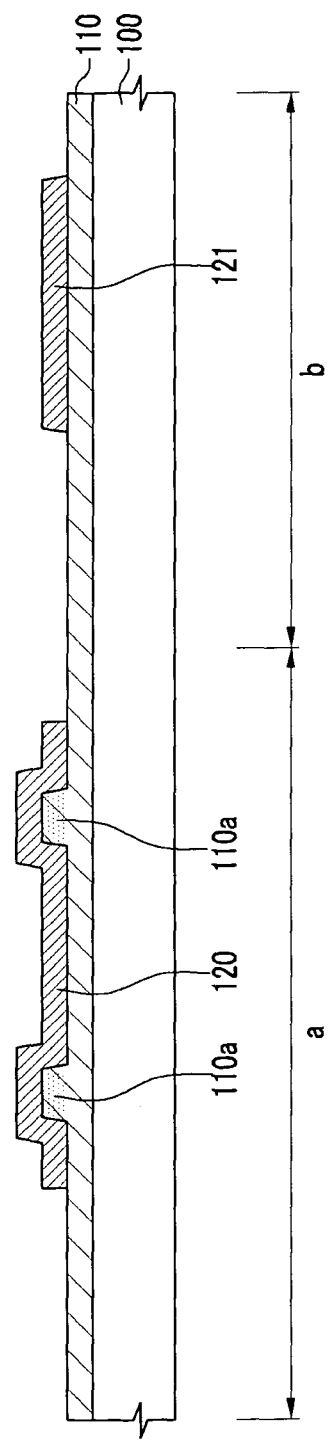

Then, referring to FIG. 1D, the crystallized amorphous silicon layer 120a may be patterned to form a first semiconductor layer 120 in the first thin film transistor region "a" and a second semiconductor layer 121 in the second thin film transistor region "b."

A lower portion of the first semiconductor layer 120 may be on the metal catalytic region 110a and may correspond to a portion where a source/drain region of the first semiconductor layer 120 will be formed; and the first semiconductor layer 120 may be crystallized by the metal catalyst of the buffer layer 110.

The second semiconductor layer 121 may be a semiconductor layer crystallized by the solid phase crystallization. Thus, it may be appreciated that the first semiconductor layer 120 and the second semiconductor layer 121 may be formed from the polycrystalline silicon layer by different crystallization methods.

Figure 1E:
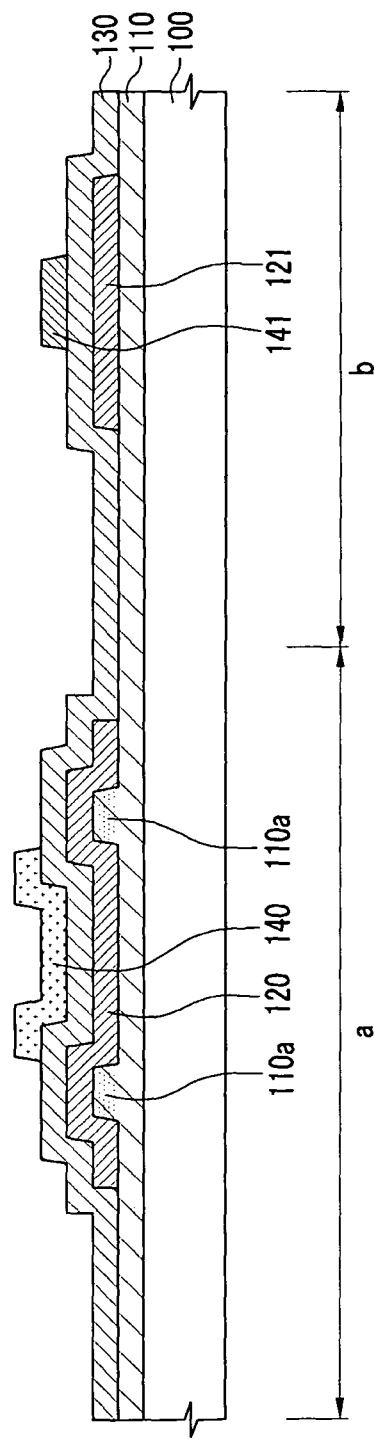

Then, referring to FIG. 1E, a gate insulating layer 130 may be formed on the substrate 100. For example, the gate insulating layer 130 may be formed on the substrate 100 having the first semiconductor layer 120 and the second semiconductor layer 121 thereon.

The gate insulating layer 130 may include, e.g., a silicon oxide layer, a silicon nitride layer, or a double layer thereof.

Then, gate electrodes 140 and 141 may be formed on the gate insulating layer 130 and may respectively correspond to the first semiconductor layer 120 and the second semiconductor layer 121.

The gate electrodes 140 and 141 may be formed by forming a single layer of aluminum (Al) or aluminum alloy, e.g., aluminum-neodymium (Al—Nd), or a multi-layer in which aluminum alloy is stacked on alloy of chromium (Cr) or molybdenum (Mo) as a metal layer (not shown) for a gate electrode, and then etching the metal layer for the gate electrode by a photolithography process.

Figure 1F:
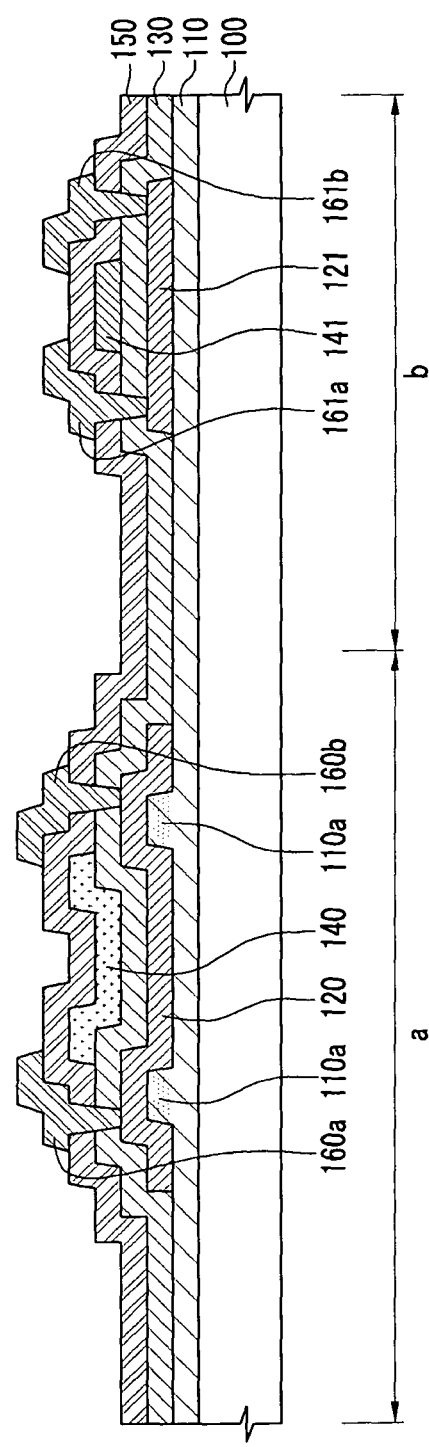

Then, referring to FIG. 1F, an inter-layer insulating layer 150 may be formed on the substrate 100. For example, the inter-layer insulating layer 150 may be formed on the substrate 100 having the gate electrodes 140 and 141 thereon. Then, source/drain electrodes 160a, 160b, 161a, and 161b respectively corresponding to the first semiconductor layer 120 and the second semiconductor layer 121 may be formed on the inter-layer insulating layer 150.

The source/drain electrodes 160a, 160b, 161a, and 161b may include, e.g., molybdenum (Mo), tungsten (W), molybdenum tungsten (MoW), tungsten silicide ($WSi_2$), molybdenum silicide ($MoSi_2$), and/or aluminum (Al).

Figure 1G:
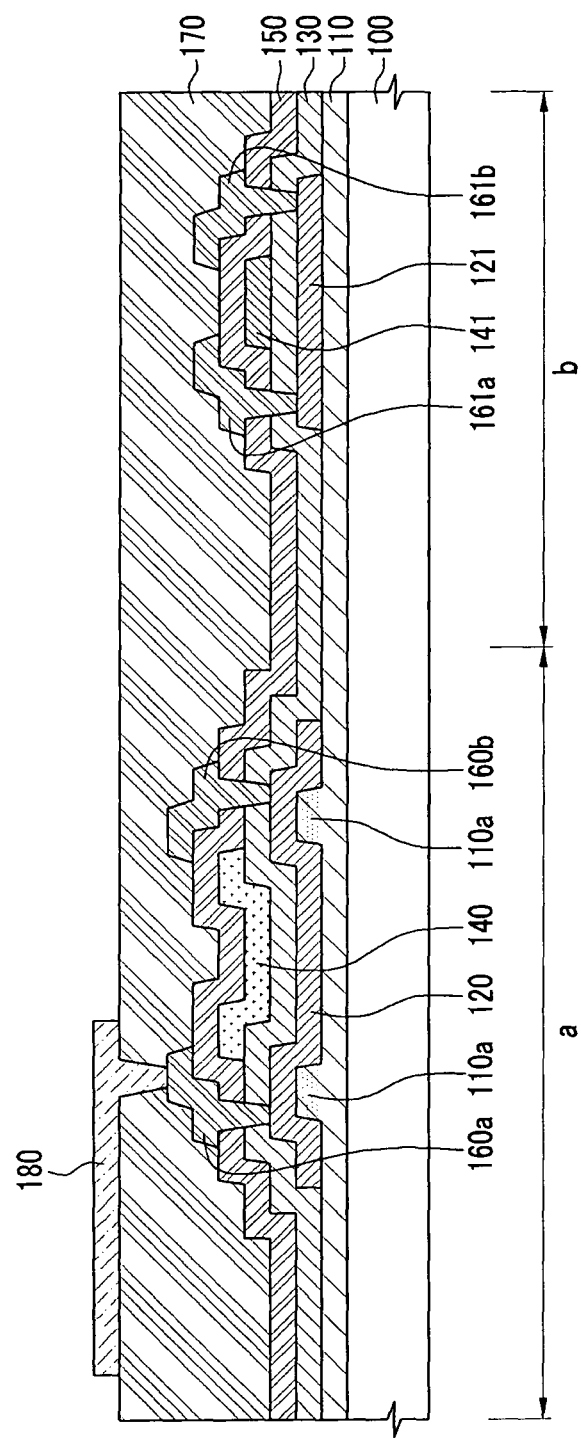

Then, referring to FIG. 1G, an insulating layer 170 may be formed on the substrate 100. For example, the insulating layer 170 may be formed on the substrate 100 having the source/drain electrodes 160a, 160b, 161a, and 161b thereon. Then, a first electrode 180 electrically connected to the source/drain electrodes 160a and 160b connected to the first semiconductor layer 120 may be formed thereon.

The insulating layer 170 may be an inorganic layer or a planarizing layer including, e.g., a silicon nitride layer, a silicon oxide layer, a multi-layer thereof, etc. Alternatively, the interlayer insulating layer 170 may include an organic-based material including, e.g., benzo cyclo butene (BCB), polyimide (Pl), polyamaide (PA), acrylic resin, phenol resin, etc. The first electrode 180 may be formed of a transparent conductive layer, e.g., ITO, IZO, and/or a mixing layer thereof, or a reflective layer, e.g., Ag, Al, and an alloy thereof.

Figure 1H:
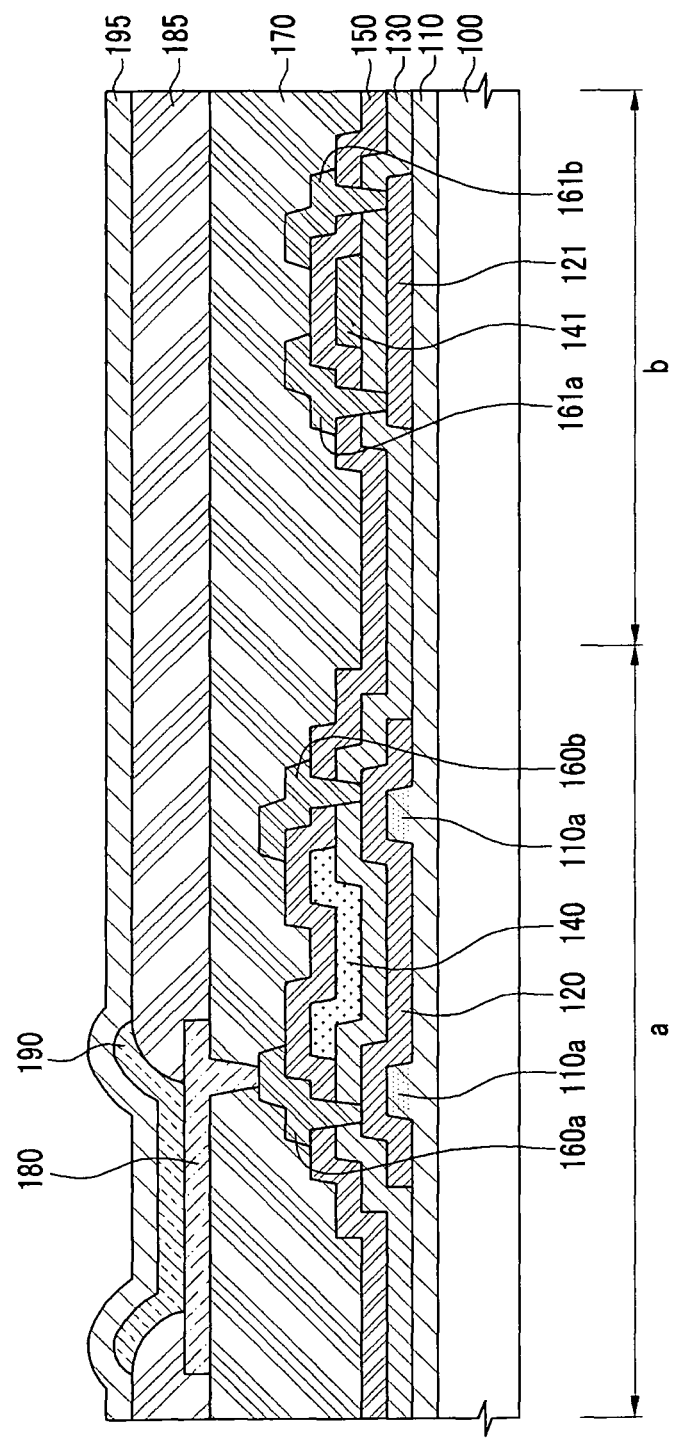

Then, referring to FIG. 1H, a pixel defining layer 185 defining pixels of the organic light emitting display may be formed on the substrate including first electrode 180 thereon.

Then, an organic layer 190 including an organic light emitting layer may be formed on the first electrode 180. Then, a second electrode 195 may be formed on the substrate 100. For example, the second electrode 195 may be formed on the substrate 100 having the organic layer 190 and the pixel defining layer 185 thereon. Thus, the organic light emitting display according to an embodiment may be completed.

FIGS. 2A to 2F illustrate diagrams showing an organic light emitting display and stages in a method of fabricating the same according to another embodiment.

When comparing the previous embodiment with the present embodiment, only gate structure of the TFT is different, e.g., the previous embodiment includes a thin film transistor having a top gate structure and the present embodiment includes a thin film transistor having a coplanar top gate. Other processes may be applied in a similar manner to the previous embodiment. Therefore, a repeated description of the same processes is omitted.

Figure 2A:
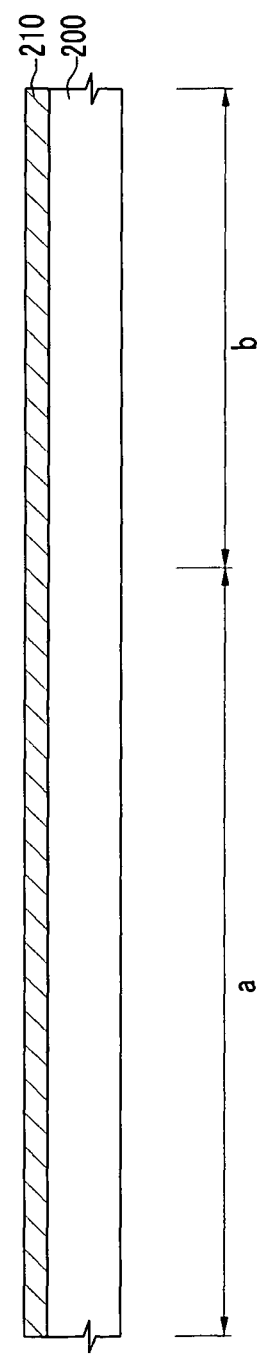
FIGS. 2A to 2G illustrate diagrams showing an organic light emitting display and stages in a method of fabricating the same, according to another embodiment.

Referring first to FIG. 2A, a substrate 200 including a first thin film transistor region "a" and a second thin film transistor region "b" may be provided. A buffer layer 210 may be formed on the substrate 200.

The buffer layer 210 may be formed as a single layer of an insulating layer, e.g., a silicon oxide layer, a silicon nitride layer, etc., or a multi-layer thereof, by using, e.g., a chemical vapor deposition method or a physical vapor deposition method.

Figure 2B:
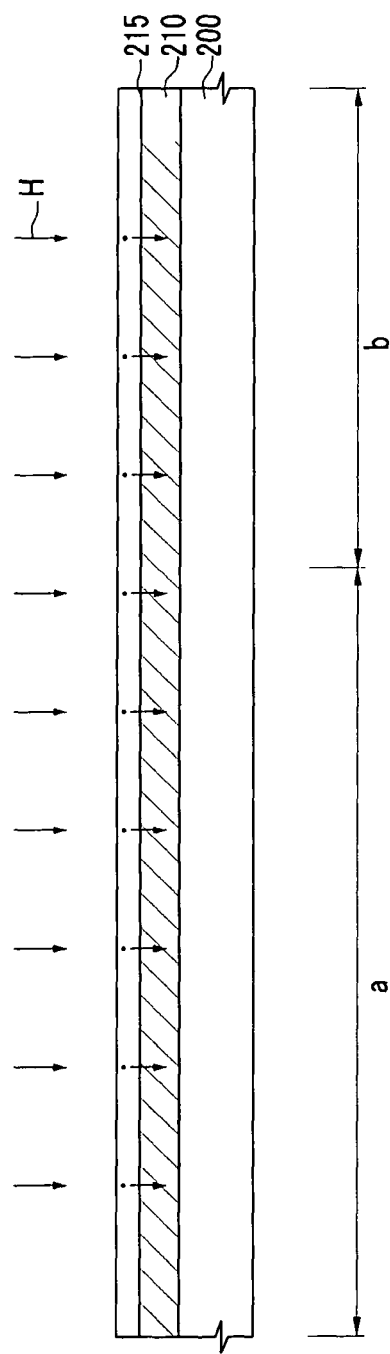

Then, as illustrated in FIG. 2B, a metal catalytic layer 215 may be formed on the buffer layer 210 and may then be subjected to heat treatment (H) to diffuse the metal catalyst of the metal catalytic layer 215 to the buffer layer 210. Then, the metal catalytic layer 215 may be removed.

The method of diffusing the metal catalyst of the metal catalytic layer 215 to the buffer layer 210 of the present embodiment may be the same as the previous embodiment and therefore, a repeated detailed description thereof will be omitted.

Figure 2C:
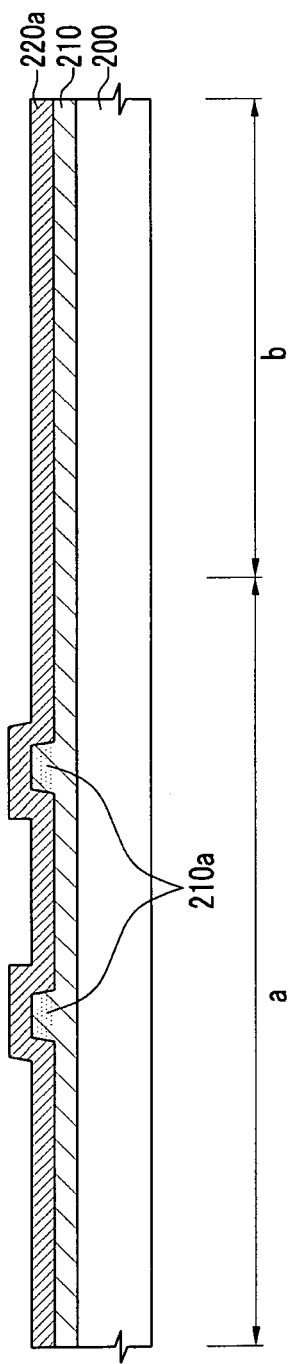

Then, referring to FIG. 2C, similar to the previous embodiment, in the first thin film transistor region "a," a portion of the buffer layer 210 may be etched to include a metal catalytic region 210a. In the second thin film transistor region "b," a surface of the buffer layer 210 where the metal catalyst is concentrated may be etched or removed.

Then, an amorphous silicon layer 220a may be formed on the buffer layer 210. Then, similar to the previous embodiment, the substrate 200 may be heat-treated by a heat treatment method used in a solid phase crystallization method, thereby crystallizing the amorphous silicon layer 220a.

The amorphous silicon layer 220a on the first thin film transistor region "a" may start to crystallize from a seed at a portion where the metal catalyst in the metal catalytic region 210a meets the amorphous silicon layer 220a, such that it may be crystallized by the metal catalyst. The amorphous silicon layer 220a on the second thin film transistor region "b" may be crystallized by a solid phase crystallization method.

Figure 2D:
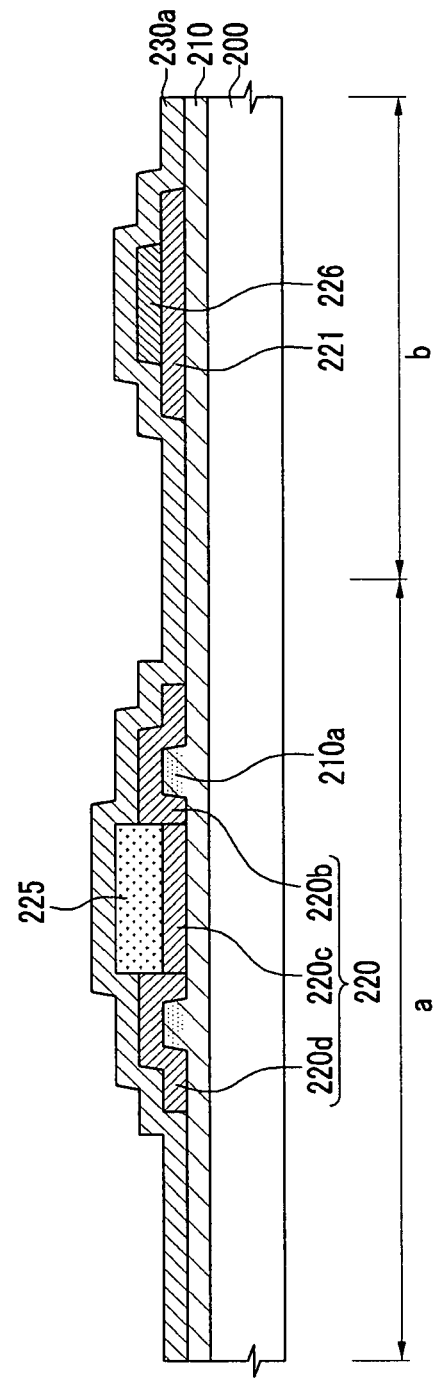

Then, referring to FIG. 2D, the crystallized amorphous silicon layer 220a may be patterned to form a first semiconductor layer 220 in the first thin film transistor region "a" and a second semiconductor layer 221 in the second thin film transistor region "b."

The metal catalytic region 210a may be patterned to correspond to source/drain regions 220d and 220b of the first semiconductor layer 220, to be described below. The first semiconductor layer may also include a channel region 220c.

Then, an etch stop layer 225, 226 may be formed on the first semiconductor layer 220 and the second semiconductor layer 221. A contact layer 230a may be formed on the substrate 200. For example, the contact layer 230a may be formed on the substrate 200 having the etch stop layer 225 and 226 thereon.

The contact layer 230a may be formed of, e.g., an n+ doped amorphous silicon layer, etc. The contact layer 230a may facilitate electrical contact between the semiconductor layers 220 and 221 and source/drain electrodes.

Figure 2E:
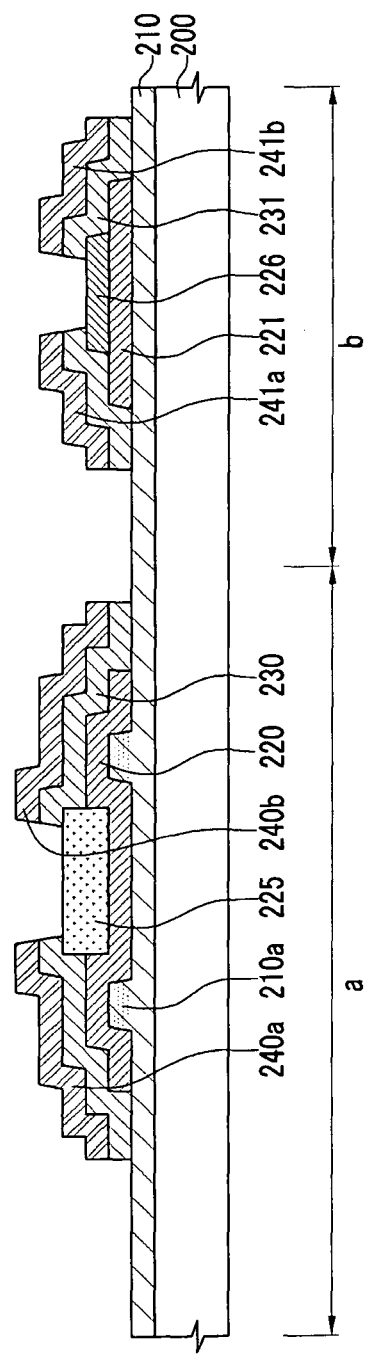

Then, referring to FIG. 2E, source/drain electrodes 240a, 240b, 241a, and 241b may be formed on the contact layer 230a and may be respectively electrically connected to the first semiconductor layer 220 and the second semiconductor layer 221.

The contact layer 230a may be simultaneously patterned while forming the source/drain electrodes 240a, 240b, 241a, and 241b, thereby forming a contact layer pattern 230 between the source/drain electrodes 240a, 240b, 241a, and 241b and the respective semiconductor layers 220 and 221.

Figure 2F:
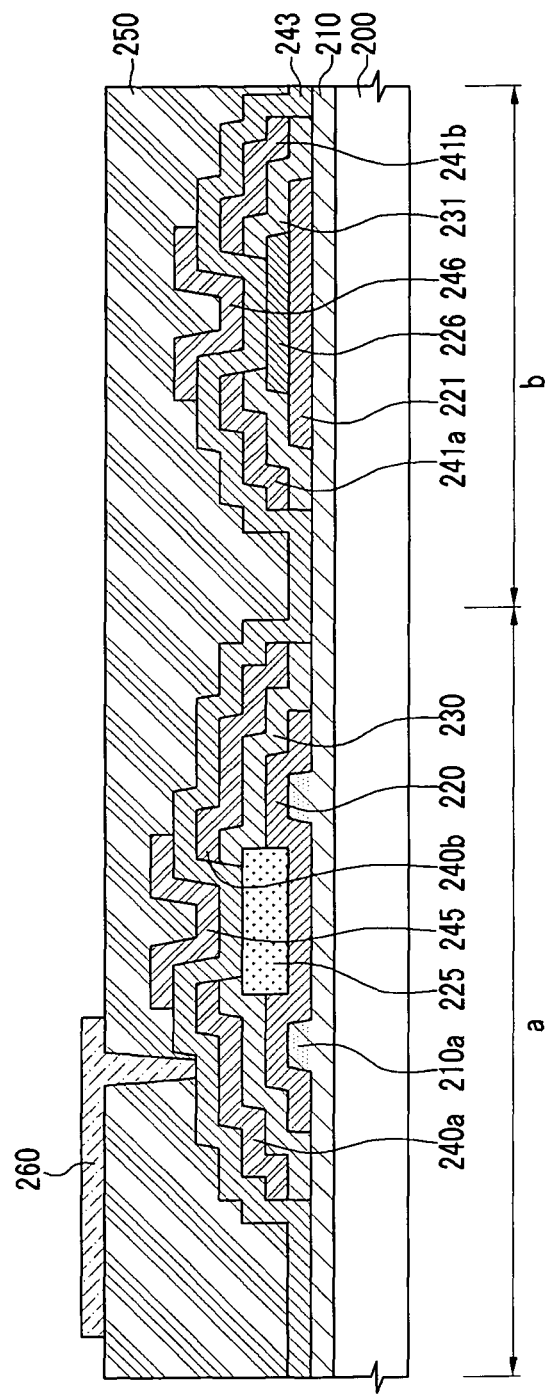

Then, referring to FIG. 2F, a gate insulating layer 243 may be formed on the substrate 200. For example, the gate insulating layer 243 may be formed on the substrate 200 having the source/drain electrodes 240a, 240b, 241a, and 241b thereon. Then, gate electrodes 245 and 246 corresponding to the first semiconductor layer 220 and the second semiconductor layer 221, respectively, may be formed on the gate insulating layer 243.

Then, an insulating layer 250 may be formed on the substrate 200. For example, the insulating layer 250 may be formed on the substrate 200 having the gate electrodes 245 and 246 thereon. A first electrode 260 connected to the source/drain electrodes 240a and 240b electrically connected to the first semiconductor layer 220 may be formed on the insulating layer 250.

The gate insulating layer 243, the insulating layer 250, and the first electrode 260 may be formed in a similar manner to the previous embodiment.

Figure 2G:
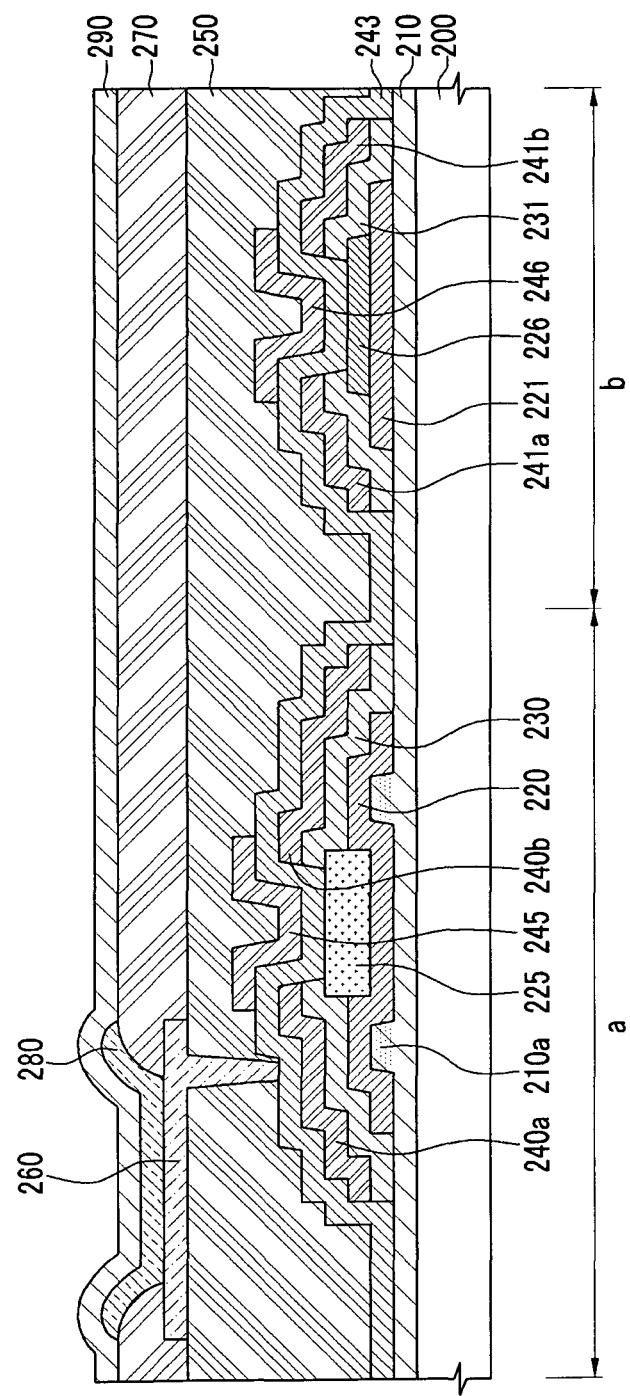

Then, referring to FIG. 2G, a pixel defining layer 270 defining pixels may be formed on the substrate 200 having the first electrode 260 thereon. An organic layer 280 including an organic light emitting layer may be formed on the first electrode 260.

Then, a second electrode 290 may be formed on the substrate 200. For example, the second electrode 290 may be formed on the substrate 200 having the organic layer 280 and the pixel defining layer 270 thereon. Thus, the organic light emitting display according to the present embodiment may be completed.

FIGS. 3A to 3E illustrate diagrams showing an organic light emitting display and stages in a method of fabricating the same according to yet another embodiment.

When comparing the previous embodiments with the present embodiment, only the gate structure of the TFT is different, e.g., one of the previous embodiments may include a thin film transistor having a top gate structure and the present embodiment may include a thin film transistor having a bottom gate structure. Other processes may be applied in a similar manner as described in the previous embodiments and therefore, repeated descriptions of the same processes are omitted.

Figure 3A:
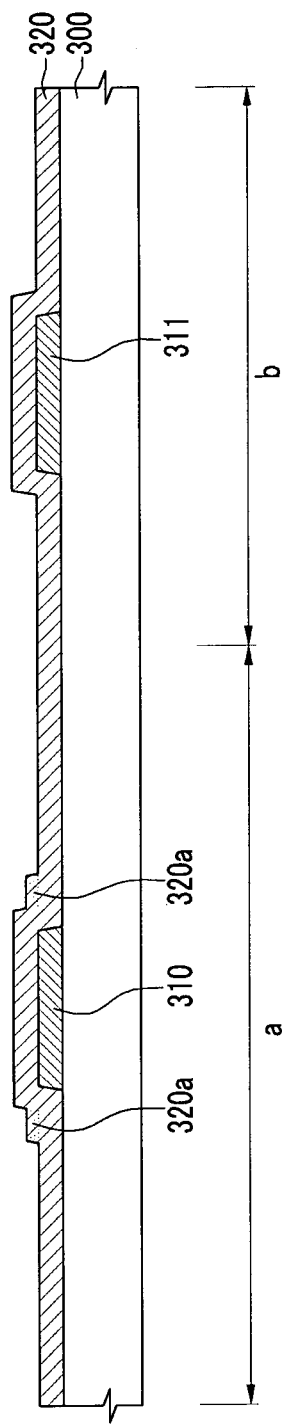
FIGS. 3A to 3E illustrate diagrams showing an organic light emitting display and stages in a method of fabricating the same, according to yet another embodiment.

First, referring to FIG. 3A, a substrate 300 including a first thin film transistor region "a" and a second thin film transistor "b" may be provided. Gate electrodes 310 and 311 corresponding to each of the first thin film transistor region "a" and the second thin film transistor region "b" of the substrate 300 may be formed thereon.

Then, a gate insulating layer 320 including a metal catalytic region 320a that is a portion where the metal catalyst is diffused in the same method as the first exemplary embodiment may be formed on the substrate 300.

The gate insulating layer 320 may be formed by forming a metal catalytic layer (not shown) on the gate insulating layer 320, diffusing the metal catalyst on the gate insulating layer 320, and then etching a surface thereof, except for the metal catalytic regions 320a. The metal catalytic region 320a may be positioned on the first thin film transistor region "a."

Figure 3B:
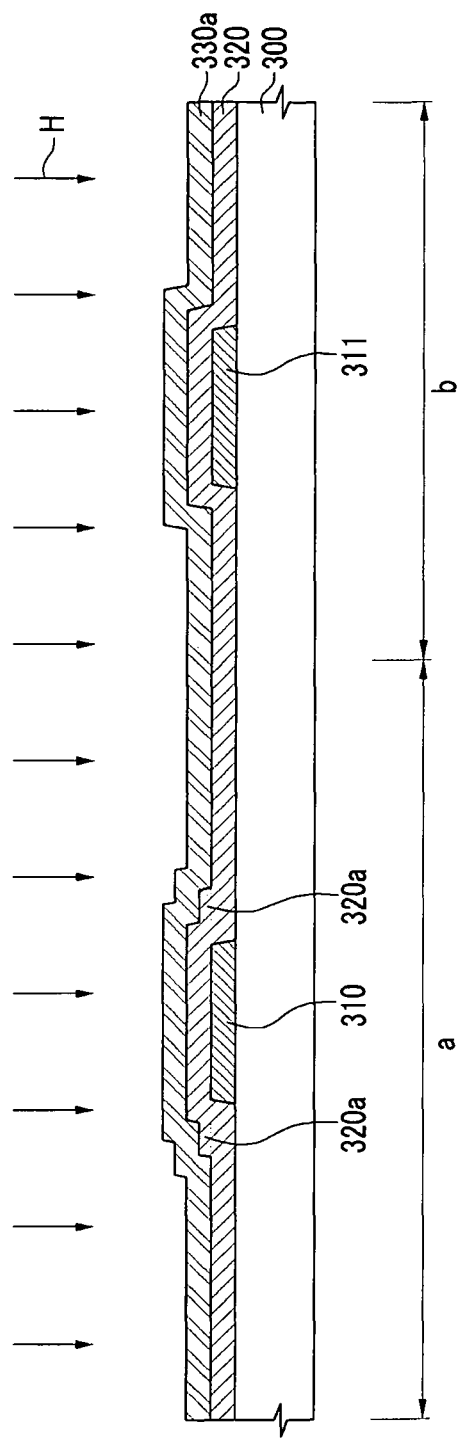

Then, referring to FIG. 3B, an amorphous silicon layer 330a may be formed on the substrate 300. For example, the amorphous silicon layer 330a may be formed on the substrate 300 having the gate insulating layer 320 thereon. Then, the substrate 300 may be heat-treated by a heat-treating method (H) used in a solid phase crystallization method.

The amorphous silicon layer 330a on the metal catalytic region 320a in the first thin film transistor region "a" may be a seed at an interface where the metal catalyst of the metal catalytic region 320a meets the amorphous silicon layer 330a. The seed may be grown as the crystal to be crystallized by the metal catalyst and the amorphous silicon layer 330a on the second thin film transistor region "b" is crystallized by the solid phase crystallization method to form the polycrystalline silicon layer 330b (see FIG. 3C).

Figure 3C:
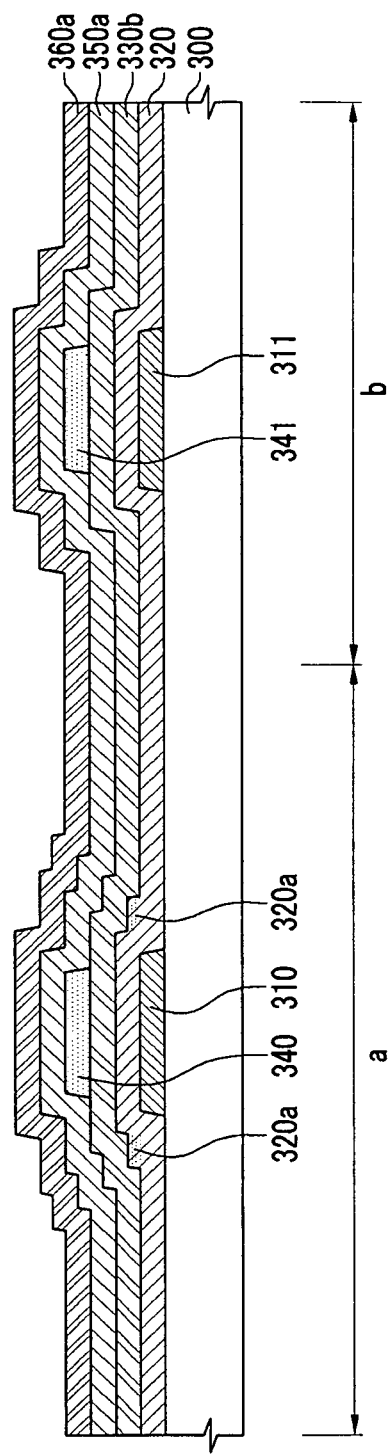

Then, referring to FIG. 3C, etch stop layers 340 and 341 respectively corresponding to the gate electrodes 310 and 311 may be formed on the crystallized polycrystalline silicon layer 330b.

Then, a contact layer 350a and a metal layer 360a for source/drain electrodes may be sequentially stacked on the substrate 300. For example, the contact layer 350a and the metal layer 360a may be sequentially stacked on the substrate 300 having the crystallized polycrystalline silicon layer 330b thereon.

Figure 3D:
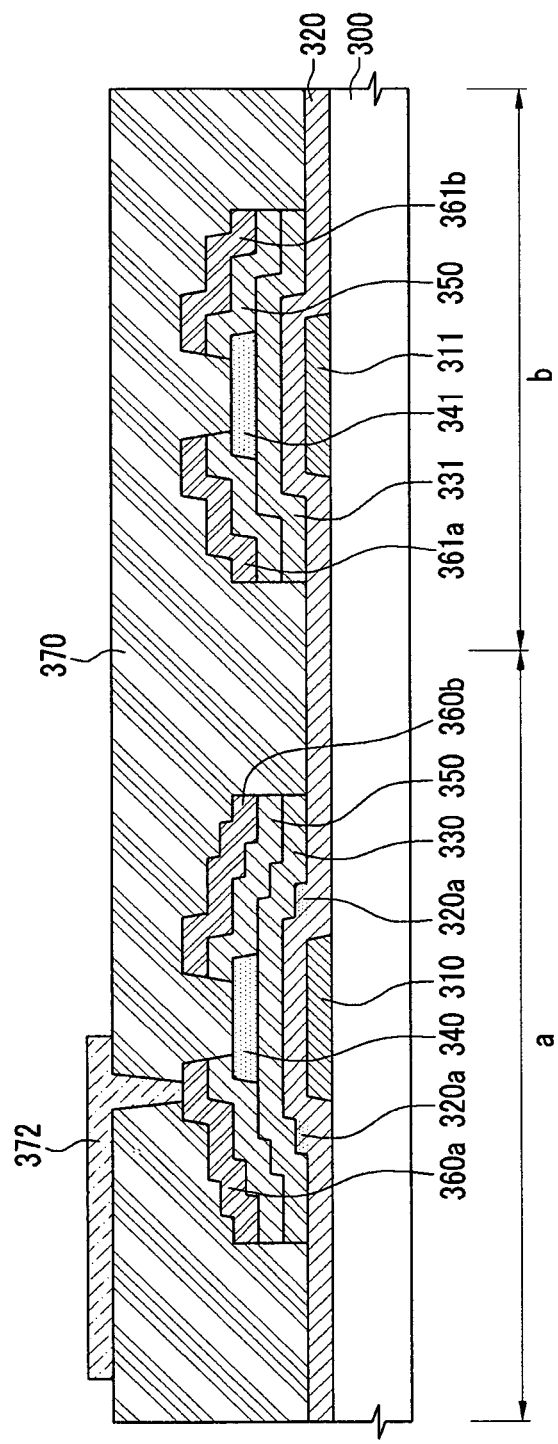

Then, referring to FIG. 3D, the contact layer 350a and the metal layer 360a for the source/drain electrodes may be simultaneously patterned to form a contact layer pattern 350 and source/drain electrodes 360a, 360b, 361a, and 361b exposing a portion of the etch stop layers 340 and 341.

Then, an insulating layer 370 may be formed on the substrate 300. For example, the insulating layer 370 may be formed on the substrate 300 having the source/drain electrodes 360a, 360b, 361a, and 361b thereon. A first electrode 372 connected to the source/drain electrodes 360a and 360b electrically connected to the first semiconductor layer 330 may be formed on the insulating layer 370.

The gate electrodes 310 and 311, the source/drain electrodes 240a, 240b, 241a, and 241b, and the first electrode 372 may be formed in the same manner as those in the previous embodiments.

Figure 3E:
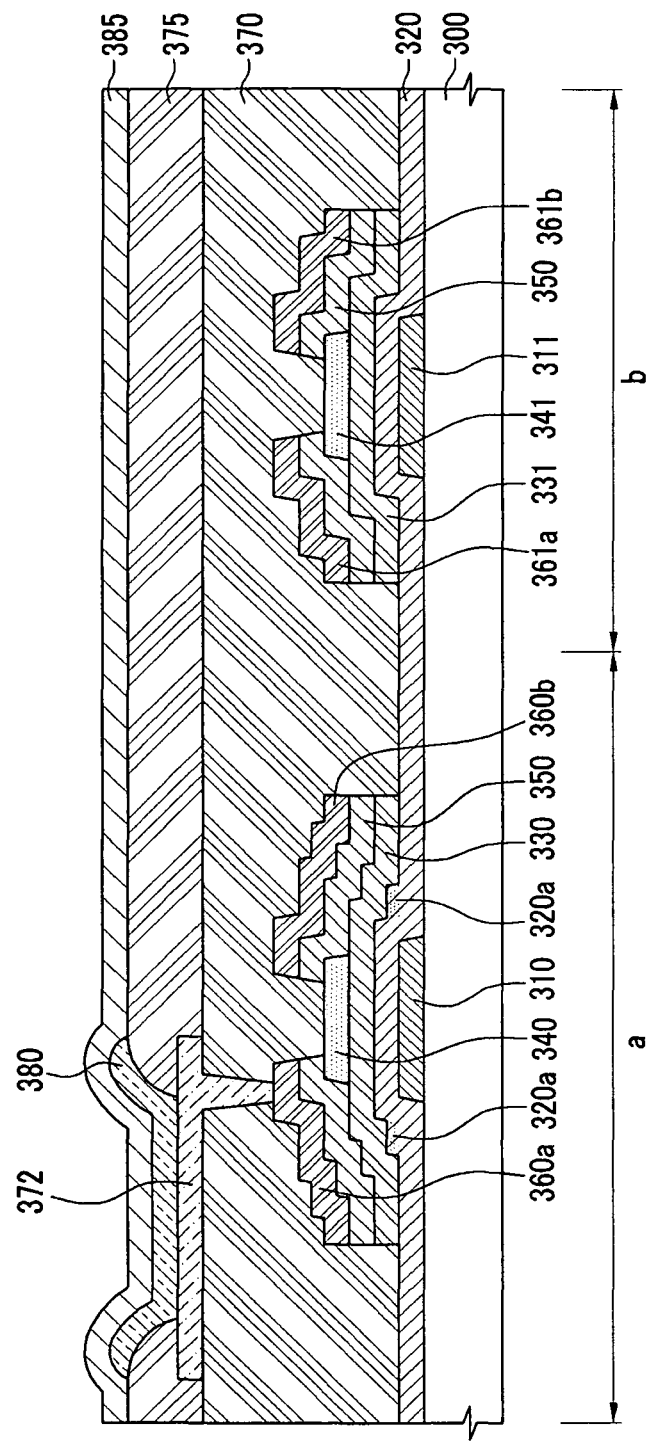

Then, as illustrated in FIG. 3E, a pixel defining layer 375 defining pixels may be formed on the substrate 300 including portions of the first electrode 372. An organic layer 380 including an organic light emitting layer may be formed on the first electrode 372.

Then, a second electrode 385 may be formed on the substrate 300. For example, the second electrode 385 may be formed on the substrate 300 having the organic layer 380 and the pixel defining layer 375 thereon. Thus, the organic light emitting display according to the present embodiment may be completed.

The first thin film transistor region "a" described with respect to the embodiments may be a driving thin film transistor region; and the first semiconductor layer described in the embodiments may be formed of the polycrystalline silicon layer crystallized by the metal catalyst. Accordingly, it may be suitable to configure the driving thin film transistor region needing a driving performance.

In addition, the second thin film transistor region "b," which may be a switching thin film transistor region, may include the second semiconductor layer crystallized by the solid phase crystallization method, such that it may meet the function of a driving TFT.

Polycrystalline silicon layers formed by the solid phase crystallization method may exhibit a low leakage current ($I_{off}$) and driving current ($I_{on}$) characteristics. Polycrystalline silicon layers crystallized by a metal catalyst may exhibit high leakage current ($I_{off}$) and driving current ($I_{on}$) characteristics.

The embodiments provide an organic light emitting display having a polycrystalline silicon layer optimally meeting characteristics of each of the driving thin film transistors and the switching thin film transistors and a method of fabricating the same.

According to the embodiments, the driving thin film transistor may include the semiconductor layer formed using the silicon layer crystallized by the metal catalyst and the switching thin film transistor includes the semiconductor layer formed using the silicon layer crystallized by heat treatment according the solid phase crystallization method to form the device meeting the characteristics of each of the thin film transistors, thereby making it possible to fabricate the organic light emitting display with improved device characteristics.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. An organic light emitting display, comprising:
a substrate, the substrate including a first thin film transistor region and a second thin film transistor region;
a buffer layer on the substrate;
a first semiconductor layer and a second semiconductor layer on the buffer layer;
a gate insulating layer on the substrate;
gate electrodes on the gate insulating layer, the gate electrodes corresponding to the first semiconductor layer and the second semiconductor layer, respectively;
source/drain electrodes insulated from the gate electrode, one of the source/drain electrodes being electrically connected to the first semiconductor layer and another of the source drain electrodes being electrically connected to the second semiconductor layer, respectively;
an insulating layer on the substrate;
a first electrode connected to the one source/drain electrode electrically connected to the first semiconductor layer;
an organic layer on the first electrode; and
a second electrode on the organic layer,
wherein portions of the buffer layer corresponding to a source/drain region of the first semiconductor layer include a metal catalyst, and
wherein the portions of the buffer layer including the metal catalyst have a thickness greater than other portions of the buffer layer.

2. The organic light emitting display as claimed in claim 1, wherein the first semiconductor layer is a driving semiconductor layer.

3. The organic light emitting display as claimed in claim 1, wherein the first semiconductor layer includes a polycrystalline silicon layer crystallized by a metal catalyst.

4. The organic light emitting display as claimed in claim 1, wherein the second semiconductor layer includes a polycrystalline silicon layer crystallized by a solid phase crystallization method.

5. The organic light emitting display as claimed in claim 1, wherein the metal catalyst includes at least one of Ni, Pd, Ag, Au, Al, Sn, Sb, Cu, and Cd.

6. The organic light emitting display as claimed in claim 1, further comprising any one of a silicon oxide layer, a silicon nitride layer, or a double layer thereof between the buffer layer and first semiconductor layer and between the buffer layer and the second semiconductor layer.

7. The organic light emitting display as claimed in claim 1, wherein the buffer layer has a thickness of about 400 Å to about 9,900 Å.

8. The organic light emitting display as claimed in claim 1, wherein the source/drain electrodes electrically connected to the first semiconductor layer contact the first semiconductor layer at the source/drain region of the first semiconductor layer that overlies the portions of buffer layer including the metal catalyst.

9. A method for fabricating an organic light emitting display, the method comprising:
providing a substrate including a first thin film transistor region and a second thin film transistor region;
forming a buffer layer on the substrate;
forming a first semiconductor layer and a second semiconductor layer on the buffer layer;
forming an etch stop layer on the first semiconductor layer and the second semiconductor layer;
forming source/drain electrodes such that the source/drain electrodes are electrically connected to the first semiconductor layer and the second semiconductor layer, respectively;
forming a gate insulating layer on the substrate;
forming gate electrodes on the gate insulating layer such that one gate electrode corresponds to the first semiconductor layer and another gate electrode corresponds to the second semiconductor layer;
forming an insulating layer on the substrate;
forming a first electrode such that the first electrode is connected to the one source/drain electrode corresponding to the first semiconductor layer;
forming an organic layer on the first electrode such that the organic layer includes an organic light emitting layer; and
forming a second electrode on the organic layer,
wherein portions of the buffer layer on a lower portion of the first semiconductor layer include a metal catalyst, and
wherein the portions of the buffer layer including the metal catalyst have a thickness greater than other portions of the buffer layer.

10. The method as claimed in claim 9, further comprising:
forming a metal catalytic layer on the buffer layer,
diffusing the metal catalyst of the metal catalytic layer to the buffer layer by heat treating the substrate, and
removing the metal catalytic layer.

11. The method as claimed in claim 10, wherein the portions of the buffer layer including the metal catalyst are a metal catalytic region and correspond to the first semiconductor layer.

12. The method as claimed in claim 11, further comprising etching a surface of the buffer layer except for the metal catalytic region after diffusing the metal catalyst to the buffer layer.

13. The method as claimed in claim 12, wherein about 100 Å to about 2,000 Å of the buffer layer is etched.

14. The method as claimed in claim 9, wherein forming the first semiconductor layer includes:
crystallizing a polycrystalline silicon layer with the metal catalyst, and
patterning the crystallized polycrystalline silicon layer.

15. The method as claimed in claim 9, wherein forming the second semiconductor layer includes:
crystallizing a polycrystalline silicon layer by a solid phase crystallization method, and
patterning the crystallized polycrystalline silicon layer.

16. An organic light emitting display, comprising:
a substrate, the substrate including a first thin film transistor region and a second thin film transistor region;
a buffer layer on the substrate;
a first semiconductor layer and a second semiconductor layer on the buffer layer;
an etch stop layer on the first semiconductor layer and the second semiconductor layer;
source/drain electrodes, one of the source/drain electrodes being electrically connected to the first semiconductor layer and another of the source/drain electrodes being electrically connected to the second semiconductor layer;
a gate insulating layer on the substrate;
gate electrodes on the gate insulating layer, the gate electrodes corresponding to the first semiconductor layer and the second semiconductor layer, respectively;
an insulating layer on the substrate;
a first electrode connected to the one source/drain electrode electrically connected to the first semiconductor layer;
an organic layer on the first electrode; and
a second electrode on the organic layer, wherein portions of the buffer layer corresponding to a source/drain region of the first semiconductor layer include a metal catalyst, and wherein the portions of the buffer layer including the metal catalyst have a thickness greater than other portions of the buffer layer.

17. The organic light emitting display as claimed in claim 16, wherein the first semiconductor layer is a driving semiconductor layer.

18. The organic light emitting display as claimed in claim 16, wherein the first semiconductor layer includes a polycrystalline silicon layer crystallized by a metal catalyst.

19. The organic light emitting display as claimed in claim 16, wherein the second semiconductor layer includes a polycrystalline silicon layer crystallized by a solid phase crystallization method.

20. The organic light emitting display as claimed in claim 16, further comprising any one of a silicon oxide layer, a silicon nitride layer, or a double layer thereof between the first semiconductor layer and the buffer layer and between the second semiconductor layer and the buffer layer.

21. The organic light emitting display as claimed in claim 16, wherein the buffer layer has a thickness of about 400 Å to about 9,900 Å.

22. An organic light emitting display, comprising:
a substrate, the substrate including a first thin film transistor region and a second thin film transistor region;
gate electrodes on the first thin film transistor region and the second thin film transistor region of the substrate, respectively;
a gate insulating layer on the substrate;
a first semiconductor layer and a second semiconductor layer on the gate insulating layer;
an etch stop layer on the first semiconductor layer and the second semiconductor layer;
source/drain electrodes, one of the source/drain electrodes being electrically connected to the first semiconductor layer and another of the source drain electrodes being electrically connected to the second semiconductor layer;
an insulating layer on the substrate;
a first electrode connected to the one source/drain electrode electrically connected to the first semiconductor layer;
an organic layer on the first electrode; and
a second electrode on the organic layer,
wherein portions of the gate insulating layer corresponding to a source/drain region of the first semiconductor layer include a metal catalyst, and
wherein the portions of the gate insulating layer including the metal catalyst have a thickness greater than other portion of the gate insulating layer.

23. The organic light emitting display as claimed in claim 22, wherein the first semiconductor layer is a driving semiconductor layer.

24. The organic light emitting display as claimed in claim 22, wherein the first semiconductor layer includes a polycrystalline silicon layer crystallized by a metal catalyst.

25. The organic light emitting display as claimed in claim 22, wherein the second semiconductor layer includes a polycrystalline silicon layer crystallized by a solid phase crystallization method.

26. The organic light emitting display as claimed in claim 22, wherein the first semiconductor layer includes a metal catalyst.

27. The organic light emitting display as claimed in claim 22, further comprising any one of a silicon oxide layer, a silicon nitride layer, or a double layer thereof between the first semiconductor layer and the buffer layer and between the second semiconductor layer and the buffer layer.

28. The organic light emitting display as claimed in claim 22, wherein the buffer layer has a thickness of about 400 Å to about 9,900 Å.

29. A method for fabricating an organic light emitting display, the method comprising:
providing a substrate that includes a first thin film transistor region and a second thin film transistor region;
forming gate electrodes on the first thin film transistor region and the second thin film transistor region of the substrate, respectively;
forming a gate insulating layer on the substrate;
forming a first semiconductor layer and a second semiconductor layer on the gate insulating layer;
forming an etch stop layer on the first semiconductor layer and the second semiconductor layer;
forming source/drain electrodes such that one of the source/drain electrodes is electrically connected to the first semiconductor layer and another of the source/drain electrodes is electrically connected to the second semiconductor layer;
forming an insulating layer on the substrate;
forming a first electrode connected to the one source/drain electrode electrically connected to the first semiconductor layer;
forming an organic layer on the first electrode such that the organic layer includes an organic light emitting layer; and
forming a second electrode on the organic layer,
wherein at least a portion of the gate insulating layer on a lower region of the first semiconductor layer is a metal catalytic region and include a metal catalyst, and
wherein the portions of the gate insulating layer including the metal catalyst have a thickness greater than other portion of the gate insulating layer.

30. The method as claimed in claim 29, further comprising:
forming a metal catalytic layer on the gate insulating layer,
diffusing a metal catalyst of the metal catalytic layer to the gate insulating layer by heat treating the substrate, and
removing the metal catalytic layer.

31. The method as claimed in claim 29, wherein the metal catalytic region includes the metal catalyst of the gate insulating layer, the metal catalytic region corresponding to the first semiconductor layer.

32. The method as claimed in claim 31, further comprising etching a surface of the gate insulating layer except for the metal catalytic region after diffusing the metal catalyst to the gate insulating layer.

33. The method as claimed in claim 29, wherein forming the first semiconductor layer includes:
crystallizing a polycrystalline silicon layer with the metal catalyst, and
patterning the crystallized polycrystalline silicon layer.

34. The method as claimed in claim 29, wherein forming the second semiconductor layer includes:
crystallizing a polycrystalline silicon layer by a solid phase crystallization method, and
patterning the crystallized polycrystalline silicon layer.

* * * * *